US010607986B2

(12) United States Patent
Li et al.

(10) Patent No.: US 10,607,986 B2
(45) Date of Patent: Mar. 31, 2020

(54) SINGLE CAPACITOR FUNCTIONING AS AN RC FILTER

(71) Applicant: Texas Instruments Incorporated, Dallas, TX (US)

(72) Inventors: Lin Li, Beijing (CN); Xiaoming Li, Beijing (CN); Xianhui Dong, Beijing (CN); Weibing Jing, Beijing (CN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/939,793

(22) Filed: Mar. 29, 2018

(65) Prior Publication Data

US 2019/0164958 A1 May 30, 2019

Related U.S. Application Data

(63) Continuation of application No. PCT/CN2017/113634, filed on Nov. 29, 2017.

(51) Int. Cl.
H01L 27/06 (2006.01)
H01L 21/8238 (2006.01)
H01L 49/02 (2006.01)
H01L 21/28 (2006.01)
H01L 21/3205 (2006.01)
H01L 29/08 (2006.01)
(Continued)

(52) U.S. Cl.
CPC .... *H01L 27/0629* (2013.01); *H01L 21/02532* (2013.01); *H01L 21/02595* (2013.01); *H01L 21/26513* (2013.01); *H01L 21/28035* (2013.01); *H01L 21/32053* (2013.01); *H01L 21/32055* (2013.01); *H01L 21/823828* (2013.01); *H01L 21/823871* (2013.01); *H01L 28/20* (2013.01); *H01L 28/60* (2013.01); *H01L 29/0847* (2013.01); *H01L 29/1095* (2013.01); *H01L 29/4916* (2013.01); *H01L 29/66181* (2013.01); *H01L 29/94* (2013.01); *H03F 3/45475* (2013.01); *H03H 7/06* (2013.01); *H01L 21/0262* (2013.01); *H01L 21/28525* (2013.01); *H01L 21/32137* (2013.01); *H01L 27/0635* (2013.01); *H03F 3/45179* (2013.01);
(Continued)

(58) Field of Classification Search
None
See application file for complete search history.

(56) References Cited

U.S. PATENT DOCUMENTS 6,034,388 A    3/2000 Brown et al.
6,246,084 B1*  6/2001 Kim ................... H01L 27/0629
                                                257/296
(Continued)

OTHER PUBLICATIONS

Patent Cooperation Treaty Search Report, dated Sep. 5, 2018, International Application. No. PCT/CN2017/113634.

*Primary Examiner* — Michelle Mandala
(74) *Attorney, Agent, or Firm* — Rose Alyssa Keagy; Charles A. Brill; Frank D. Cimino

(57) ABSTRACT

An IC includes an RC filter, a doped layer under a first dielectric layer, a polysilicon layer on the first dielectric layer providing a polysilicon plate for a capacitor of the filter, and gate(s) for MOSFET(s). A second dielectric layer is on the polysilicon plate. An input contact is on one end of the polysilicon plate and an output contact is on the opposite end. A metal layer includes metal providing contact to at least input contact and metal providing contact to the output contact. Analog circuitry includes the MOSFET having an I/O node coupled to the RC filter.

17 Claims, 11 Drawing Sheets

(51) Int. Cl.
    *H01L 21/265*     (2006.01)
    *H03H 7/06*     (2006.01)
    *H01L 29/49*     (2006.01)
    *H01L 21/02*     (2006.01)
    *H01L 29/10*     (2006.01)
    *H01L 29/94*     (2006.01)
    *H03F 3/45*     (2006.01)
    *H01L 29/66*     (2006.01)
    *H01L 21/285*     (2006.01)
    *H01L 21/3213*     (2006.01)

(52) U.S. Cl.
    CPC .. *H03F 2200/165* (2013.01); *H03F 2200/267* (2013.01); *H03F 2203/45156* (2013.01); *H03F 2203/45526* (2013.01)

(56) References Cited

U.S. PATENT DOCUMENTS

| | | | |
|---|---|---|---|
| 8,372,713 B2* | 2/2013 | Masuoka | H01L 27/0207 257/329 |
| 2002/0008290 A1 | 1/2002 | Assaderaghi et al. | |
| 2006/0244061 A1* | 11/2006 | Nowak | H01L 27/0805 257/347 |
| 2007/0057343 A1* | 3/2007 | Chinthakindi | H01L 28/40 257/532 |
| 2007/0235788 A1* | 10/2007 | Kao | H01L 27/0629 257/303 |
| 2009/0302364 A1 | 12/2009 | Duarte de Martin et al. | |
| 2012/0175707 A1* | 7/2012 | Jung | H01L 21/28518 257/368 |

\* cited by examiner

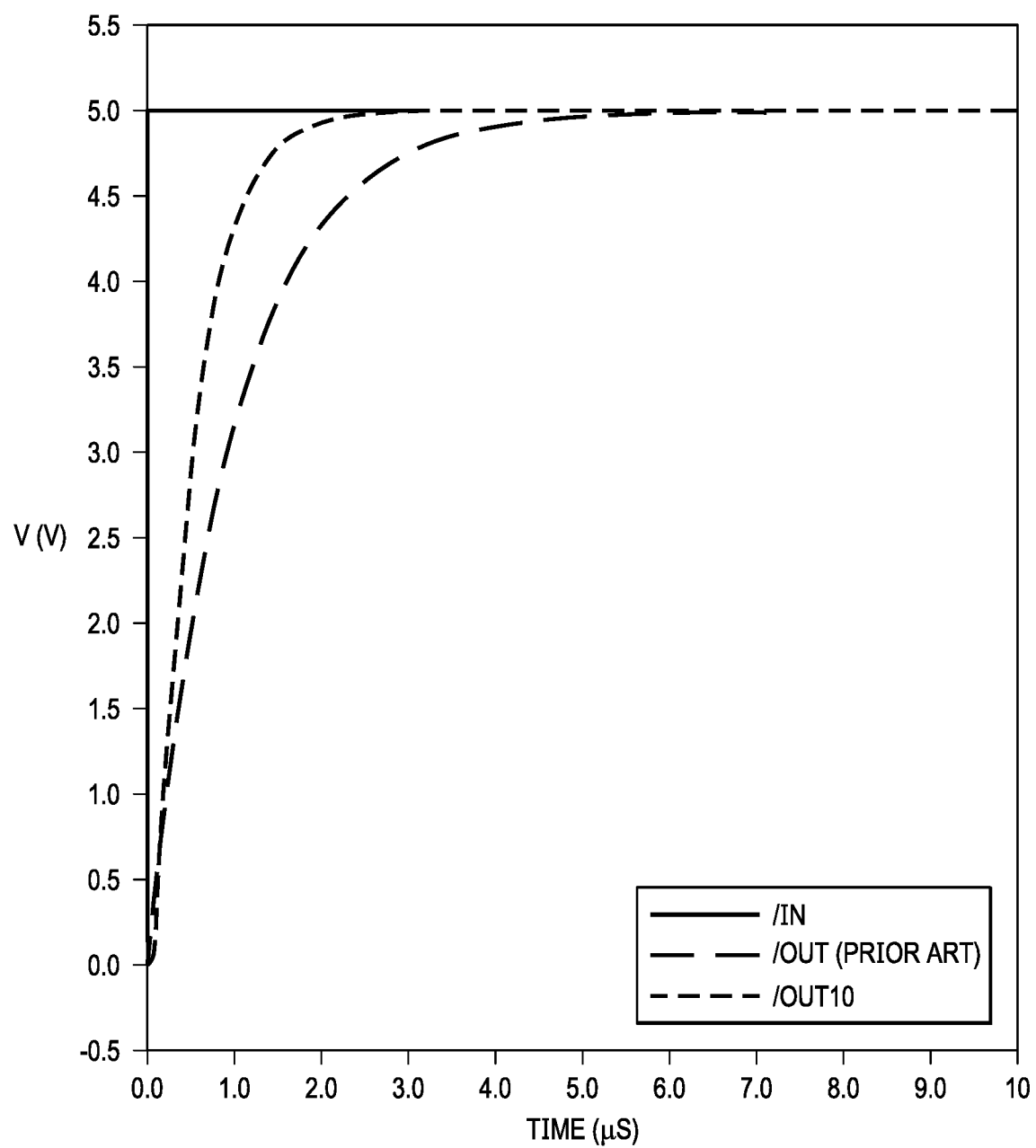

SINGLE CAPACITOR FUNCTIONING AS AN RC FILTER

FIELD

Disclosed aspects relate to semiconductor devices having resistor and capacitor (RC) filters.

BACKGROUND

An RC filter (or RC network) is a common circuit unit used in a wide variety of different integrated circuits (ICs), particularly analog circuits. One example is for realizing a low pass (LP) filter to filter out high frequency noise, suppress electromagnetic interference (EMI), or to provide a more stable output signal. However, RC filters can also be configured as high-pass filters. The traditional way to form a first order (i.e., single pole) RC filter is use two discrete devices side-by-side on the die, including a separate R and a C hooked up in series, and in the case of a low pass filter to take the RC filter's output across the plates of the C.

Often the resistance of the R needs to be a high value, typically in a range from tens of ohms to tens of mega ($10^6$) ohms. Sheet resistance (in ohms/square (sq)) is a R area independent resistance measurement used to characterize different materials that is inversely related to the thickness of the R layer. The sheet resistance varies significantly for different materials, from several milli-ohm/sq for a metal layer to tens of kilo-ohm/sq for an undoped polysilicon layer. When one knows the shape of the R (thus its length and width), the number of squares is known, which enables using the sheet resistance multiplied by the number of squares to calculate the resistance value of the R.

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects include methods for forming an IC including forming a single C that includes at least one modification to enable it to function as an RC filter, and ICs therefrom that include an analog circuitry comprising at least one metal-oxide-semiconductor field-effect transistor (MOSFET) having an input node or an output (I/O) node coupled to the RC filter. Disclosed ICs include an RC filter, a doped diffusion layer under a first dielectric layer, a polysilicon layer on the first dielectric layer providing a polysilicon plate for a C of the RC filter and a gate for at least one MOSFET on the IC.

A second dielectric layer is on the polysilicon plate. An input contact is on one end of the polysilicon plate and an output contact is on an opposite end of the polysilicon plate. A metal layer contacts at least the input contact and the output contact. Analog circuitry includes at least one MOSFET having an I/O node coupled to the RC filter.

BRIEF DESCRIPTION OF THE DRAWINGS

Reference will now be made to the accompanying drawings, which are not necessarily drawn to scale, wherein:

FIG. 8A shows the transient performance showing Vout from a traditional RC filter having a separate R and C, and a disclosed RC filter properly modeled as a distributed RC filter as a function of time after receiving an input pulse shown as IN, while

DETAILED DESCRIPTION

Figure 1A:
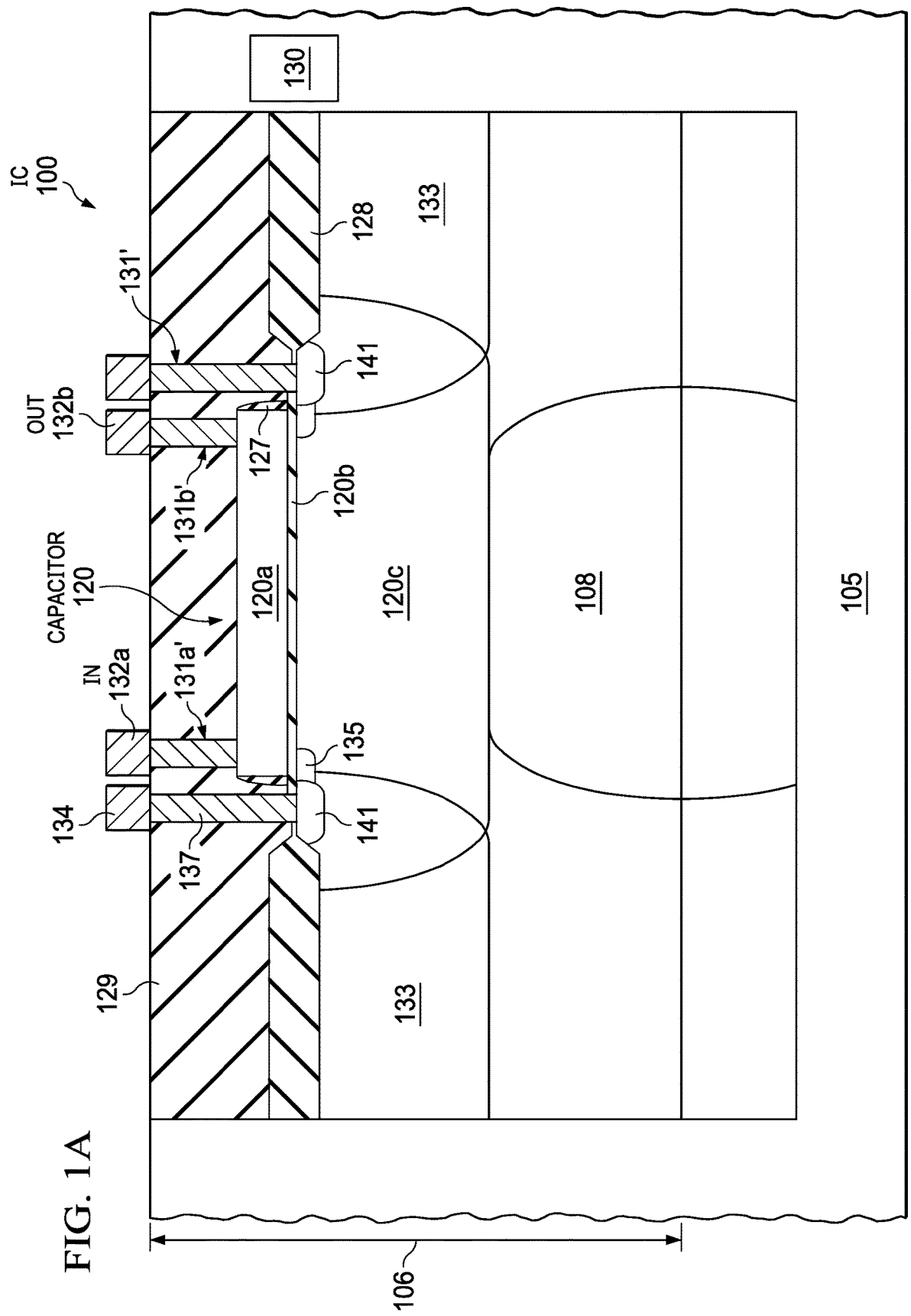
FIG. 1A and FIG. 1B are cross sectional depictions of a portion of an IC with FIG. 1B being a more detailed view showing a disclosed C modified to function as a disclosed RC filter as part of the IC, where the C's polysilicon plate is its top plate, according to an example aspect.

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

Disclosed aspects recognize that in some IC applications that have RC filters the accuracy of the resistance value for the R of an RC filter may not be important to function of the IC. A conventional RC filter comprising a discrete R side-by-side with a discrete C hooked in series will consume significant area as IC area is needed for each of these separate filter elements. Polysilicon is commonly used for one of the plates of the C. By controlling the existence of silicide on the surface of polysilicon layer and by controlling the polysilicon doping, one can provide a polysilicon resistance value in the 10 Ohm/sq to 500 kilo-ohm/sq range. If the IC process only provides one polysilicon layer, then the polysilicon layer will generally also be used as MOS gates. In a process that can provide more than one polysilicon layer, the bottom polysilicon layer is often also used as the MOS gates. By controlling the thickness of the C's dielectric layer to be thin one can obtain a high unit capacitance value, such as in the range from 0.1 fF to 20 fF/$\mu m^2$.

Disclosed RC filters modify the polysilicon plate of a generally parallel plate C to provide a design tunable sheet resistance and thus a tunable resistance value, and independently a design tunable capacitance value. The C's polysilicon plate can be a top plate (e.g., polysilicon over doped silicon) shown in FIGS. 1A and B described below, or a bottom plate (metal over polysilicon) shown in FIG. 1C described below, which in either configuration has the polysilicon plate configured to also provide the feature of a R. Combined with its own capacitance, disclosed RC filters use the C's area to function as a RC filter.

For example in an IC process including a silicide on the polysilicon layer, using a silicide block the generation region for silicide formation on the polysilicon plate of the capacitor can be controlled to block it over the polysilicon plate, and the doping of the polysilicon plate (often the top plate of the C) can also be controlled such as by blocking (e.g., with a masking layer) the source/drain implant for the MOS devices on the IC. This provides a resistivity and thus a sheet resistance value that is significantly higher as compared to the resistance value it would otherwise be from the polysilicon plate. The capacitance of the C (set by the plate area, the thickness of the dielectric material, and the dielectric constant of the dielectric material) does not change during disclosed polysilicon plate modifications. Thus a distributed RC filter is realized by a single C area. There is no need for any additional IC mask(s) to implement disclosed RC filters.

For an ideal C on an IC, the top and bottom plate's resistance is generally designed to be as low as possible as it is series resistance with the capacitance provided by the C. However, disclosed RC filters use the polysilicon plate of the C instead to function as the R, so that the sheet resistance of the polysilicon plate in some examples is purposely elevated. The capacitance value is not changed during the modification to polysilicon plate, because the capacitance of the C is dominated by the dielectric material and its thickness. Disclosed methods do not change the capacitance during the steps that modify the polysilicon plate. The main elements that influence the plate polysilicon sheet resistance are recognized to be:

1. The existence of silicide thereon which if present lowers the total polysilicon plate resistance value, so that the silicide on polysilicon in the process is blocked when it is desired to elevate the polysilicon plate's resistance.
2. The doping applied to the polysilicon plate. The polysilicon plate conventionally receives both the lightly doped drain (LDD) implant and source and drain implant applied to MOS devices on the IC. Because the source and drain implant is at a much higher dose as compared to the LDD implant, the source and drain implant will significantly lower the polysilicon plate's sheet resistance, so that in some arrangements the source and drain implant is blocked from reaching the polysilicon plate area.

Figure 6:
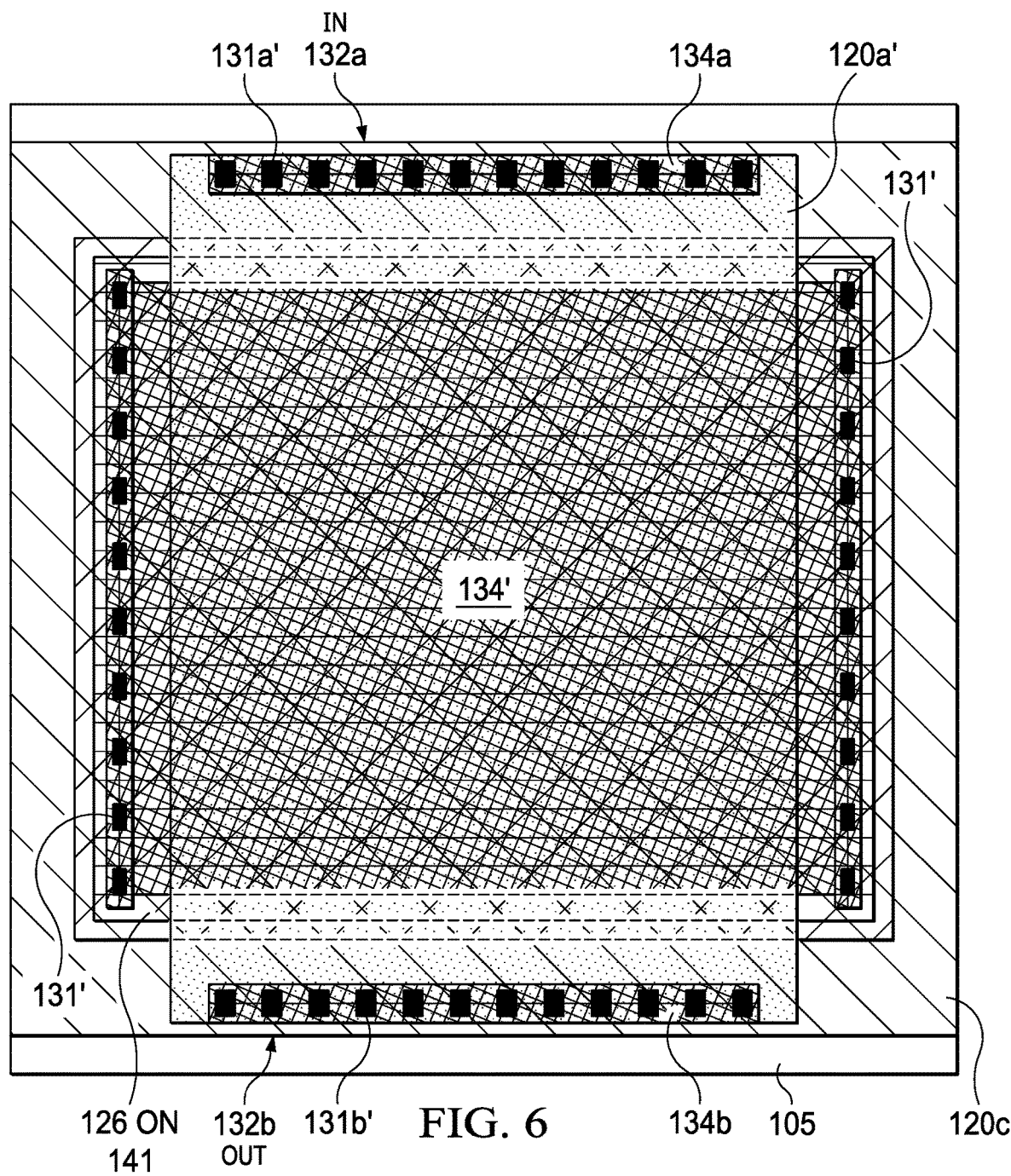
FIG. 6 shows an RC filter having a top metal plate which is shorted on the IC to the bottom doped semiconductor plate, with a polysilicon middle plate, so that the resulting structure forms a sandwich structure.

As noted above, the polysilicon plate can be a top plate over a pwell such as an NMOS gate C (with an n+ polysilicon gate), or over an nwell such as a PMOS gate capacitor (with a p+ polysilicon gate), or as a middle plate together with a bottom plate and a metal top plate (see FIG. 6 described below). Another arrangement is with a second polysilicon plate to form a polysilicon-polysilicon C that can be used in IC processes that have two (or more) layers of polysilicon. Some analog IC processes provide two layers of polysilicon, with some special purpose IC processes even providing up to five or more layers of polysilicon. Yet another arrangement has the polysilicon plate being the bottom plate of the C with a metal (typically metal 1 (M1)) over a dielectric (e.g., pre-metal dielectric) over a disclosed polysilicon plate. The disclosed polysilicon plate can thus be the top plate, bottom plate, or a middle plate of the C.

Figure 1B:
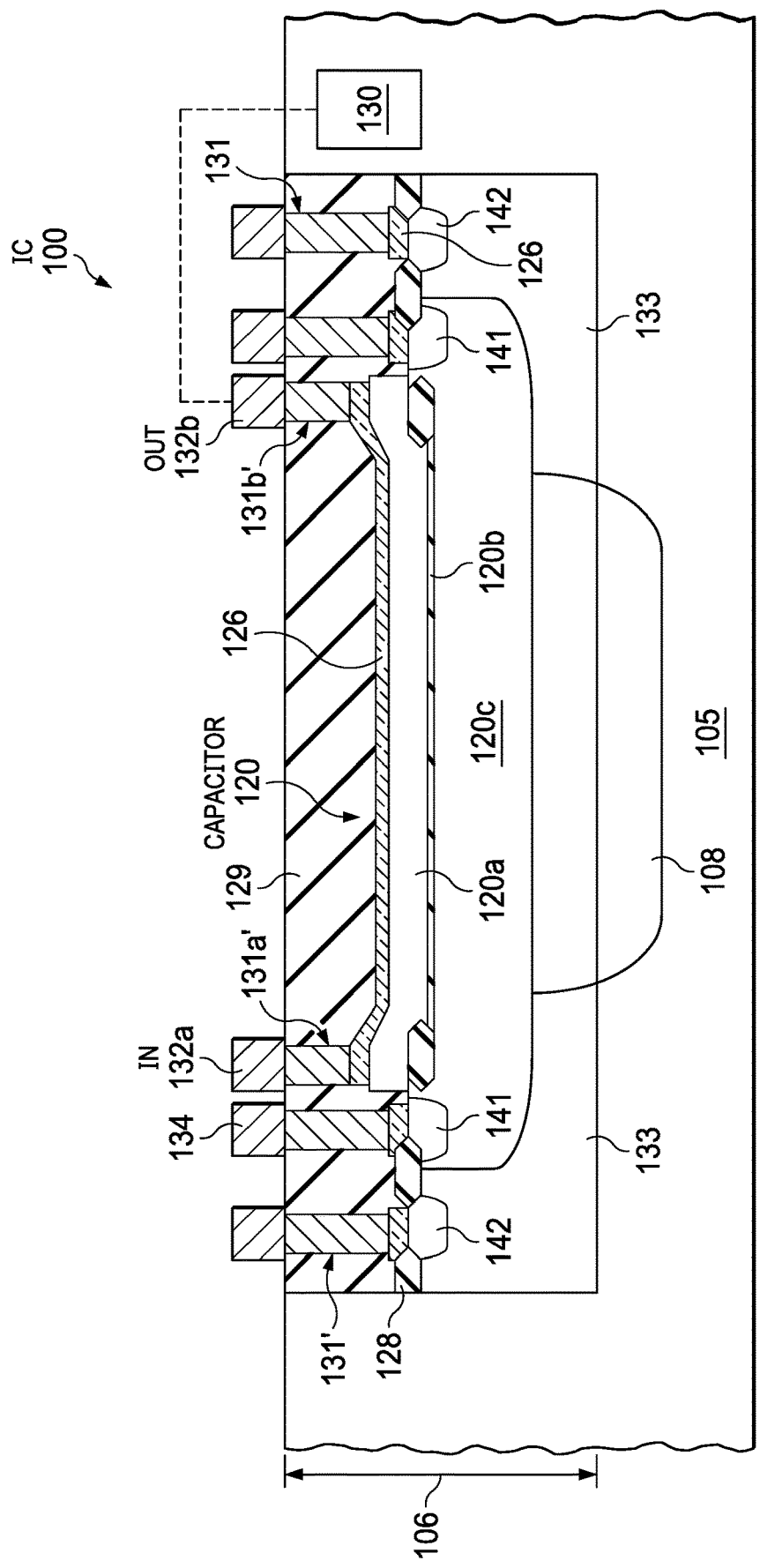

FIG. 1A and FIG. 1B are cross sectional depictions of a portion of an IC 100 with FIG. 1B being a more detailed view showing a disclosed C 120 modified to function as a disclosed RC filter as part of an IC where the C's polysilicon plate is its top plate, according to an example aspect. The IC 100 is formed on a semiconductor surface of a substrate 105, for example as a p-epitaxial (epi) layer providing a semiconductor surface 106 on a substrate 105 that can comprise a p+ bulk silicon substrate.

The substrate 105 and/or semiconductor surface 106 can comprise silicon, silicon-germanium, other Group 4 material, or other semiconductor materials including III-V or II-VI compound semiconductor materials. The IC 100 also includes functional circuitry 130 shown by a circuitry block that realizes and carries out a desired functionality, such as that of a digital IC (e.g., digital signal processor) or analog IC (e.g., amplifier or power converter), and in one example a BiCMOS (MOS and Bipolar) IC. The capability of functional circuitry provided on a disclosed IC may vary, for example ranging from a simple device to a complex device. The specific functionality contained within functional circuitry is not of importance to disclosed ICs. The functional circuitry 130 can comprise analog circuitry comprising at least one MOSFET having an input node or an output node coupled to the RC filter 120. The dashed line in FIG. 1B is used to indicate the coupling between the C 120 and the functional circuitry 130.

The RC filter is implemented as a modified C 120 as shown which comprises a polysilicon top plate 120a which can be doped n-type or p-type and a bottom plate 120c that comprises a doped diffusional layer that can be a pwell or an nwell. A dielectric layer 120b is in between the polysilicon top plate 120a and bottom plate 120c which can be the gate dielectric (e.g., silicon oxide) also used by the MOS devices on the IC 100, such as comprising 2 nm to 200 nm of silicon oxide or silicon oxynitride. A silicide layer 126 such as comprising $CoSi_2$ or $TiSi_2$ is shown in FIG. 1B on top of the polysilicon top plate 120a, which is generally over the polysilicon elsewhere on the IC 100 including as shown in FIG. 1B contacting both the p+ contacts 142 and n+ contacts 141. As known in the art the silicide minimize parasitic resistance for polysilicon when it is used as an interconnect, which also lowers the contact resistance to silicon or to polysilicon.

Other layers shown in FIG. 1A and/or FIG. 1B include a spacer 127 on the sidewalls of the polysilicon top plate 120a to enable forming lightly doped drains (LDDs) 135, such as comprising silicon nitride, and oxide isolation shown as field oxide 128 which can also be trench isolation, such as shallow trench isolation (STI). There is also an interlevel dielectric (ILD) layer 129 that has conductor (e.g., tungsten (W)) fill material 137 in the vias formed in the ILD layer 129 (see vias 131 in FIG. 5D described below) to provide filled vias 131' for contacting various nodes on the semiconductor surface. A patterned metal layer shown as metal 1 has a plurality metal portions shown as including an input (IN)

terminal 132a and an output (OUT) terminal 132b for the C 120 that contact filled vias 131a' and 131b', respectively, to provide contact to the polysilicon top plate 120a, and metal 134 that contacts the doped n+ 141 and p+ 142 contacts using filled vias 131' (contacts 142 shown in FIG. 1B). In FIG. 1B, one end of the polysilicon top plate 120a is a metal portion on a filled via 131' shown as IN 132a, and on the opposite end of the polysilicon top plate 120a is metal portion on a filled via 131' shown as OUT 132b.

The bottom plate 120c can be an nwell on top of a buried layer 108 and the other well doped the other type is shown as 133 which is a pwell when bottom plate 120c is an nwell. When the bottom plate 120c is an nwell, doped contacts 141 to the bottom plate 120c are n+, and contacts 142 to the well 133 that being a pwell are p+ contacts. Although not shown in FIG. 1A and FIG. 1B over the doped contacts 141 and 142, there can also be a silicide layer on top of these contacts to lower the resistance of the contact between the filled vias 131' and the doped semiconductor. The buried layer 108 is an optional layer for the RC filter.

Figure 1C:
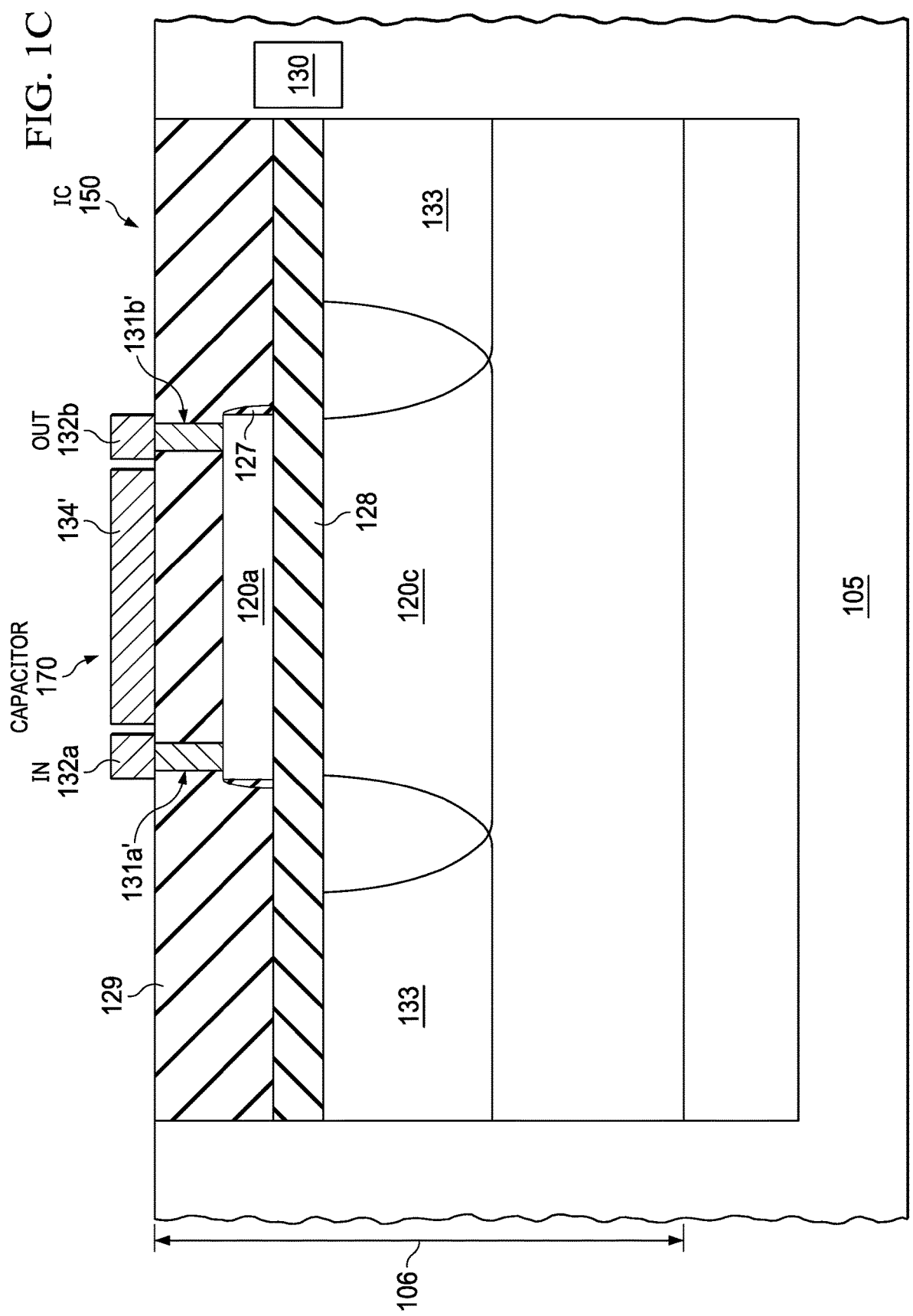
FIG. 1C is a cross sectional depiction of a portion of an IC showing a disclosed C modified to function as a disclosed RC filter as part of the IC, where the C's polysilicon plate is its bottom plate, according to an example aspect.

FIG. 1C is a cross sectional depiction of a portion of an IC 150 showing a disclosed C 170 modified to function as a disclosed RC filter as part of the IC, where the C's 170 polysilicon top plate 120a is its bottom plate, according to an example aspect. In this aspect the C's 170 top plate is a metal plate shown as 134' that is on the ILD layer 129.

There are three example C arrangements with a modified polysilicon plate modified to function as a RC filter described below. There can be a variety of variations based on the below described C arrangements. These disclosed C arrangements provide a minimum resistance and unchanged capacitance (see FIG. 2 described below), a medium resistance and unchanged capacitance (see FIG. 3 described below), and a maximum resistance and unchanged capacitance (see FIG. 4 described below).

Figure 2:
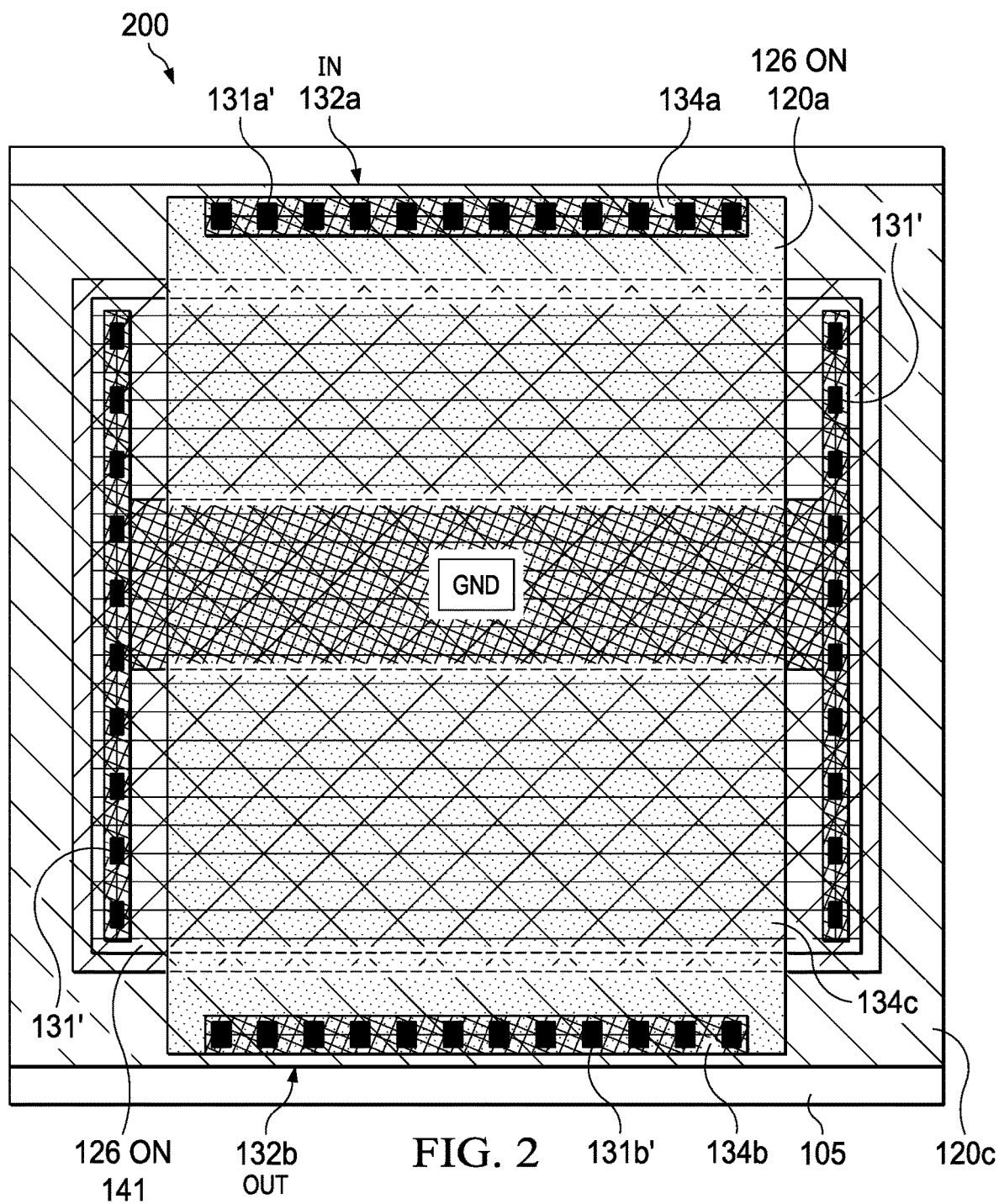
FIG. 2 shows a first arrangement comprising an RC filter, where the layout of RC filter has a minimum resistance value and an unchanged capacitance value from the modification to the polysilicon plate, according to an example aspect.

FIG. 2 shows a first arrangement comprising an RC filter 200, where the layout of RC filter 200 has minimum resistance and an unchanged capacitance resulting from the modification to the polysilicon top plate 120a. Even though there is no change to the material of the C's polysilicon top plate 120a or its doping as the polysilicon top plate 120a still receives silicide 126 and the source and drain implant to form n+ contacts 141, there is still significant intrinsic resistance for the polysilicon top plate 120a. Moreover, there is no needed change to the shape of the polysilicon top plate 120a so that the polysilicon top plate 120a may various shapes including rectangular in shape as generally shown herein.

The IN terminal 132a and the OUT terminal 132b can comprise a string of multiple vias. The IN terminal 132a is shown as a metal strip 134a that connects to one end of the polysilicon top plate 120a through a string of multiple filled vias 131' as shown. Similarly, the OUT terminal 132b is shown as a metal strip 134b that connects to the opposite end in the length direction of the polysilicon top plate 120a through a string of multiple filled vias 131'. As known in the art, such multiple via arrangements is generally referred to as a contact layer in the process.

Figure 7:
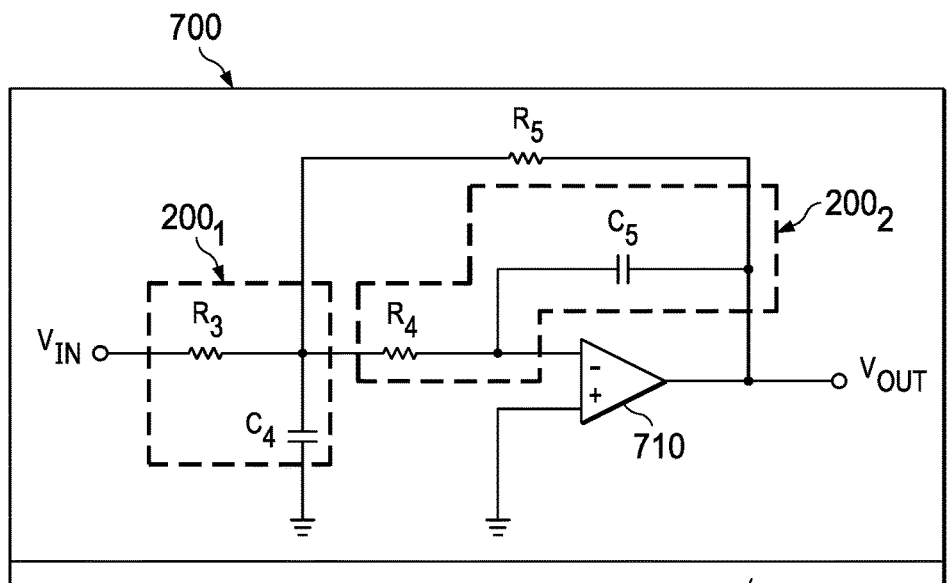
FIG. 7 depicts an analog IC that include an analog circuitry formed on a semiconductor substrate comprising at least one MOSFET having an IO node coupled to the RC filter.

The doped diffusion layer in this aspect being the bottom plate 120c is shown being contacted by an H-shaped metal strip 134c (including over the polysilicon top plate 120a) identified as a ground (GND) terminal that connects through a silicide layer 126 over doped contacts 141 to the respective ends of the bottom plate 120c (both ends contacted to reduce parasitic resistance) by a string of multiple filled vias 131' as shown. It is noted the second terminal of the RC filter, here the doped diffusion layer shown as the bottom plate 120c, need not be grounded, such as shown in FIG. 7 described below.

The IN terminal 132a and the OUT terminal 132b are thus part of the RC filter 200 (C including R), not simply two connections to the capacitor of an RC filter. Accordingly, by changing the location of the OUT terminal 132b of the RC filter 200 as shown in FIG. 2 to the ends of the polysilicon top plate 120a that is opposite to the IN terminal 132a and the RC filter's 200 OUT terminal 132b on the bottom end of the polysilicon top plate 120a, one can utilize the intrinsic resistance of the polysilicon plate (usually around a few hundred ohms) to provide RC filter 200 that has a minimum R value. This modification to the polysilicon plate comprising only a contact layout change provides the RC filter 200 with a relatively small resistance (compared to the other disclosed arrangements) in series with the capacitance provided.

Figure 3:
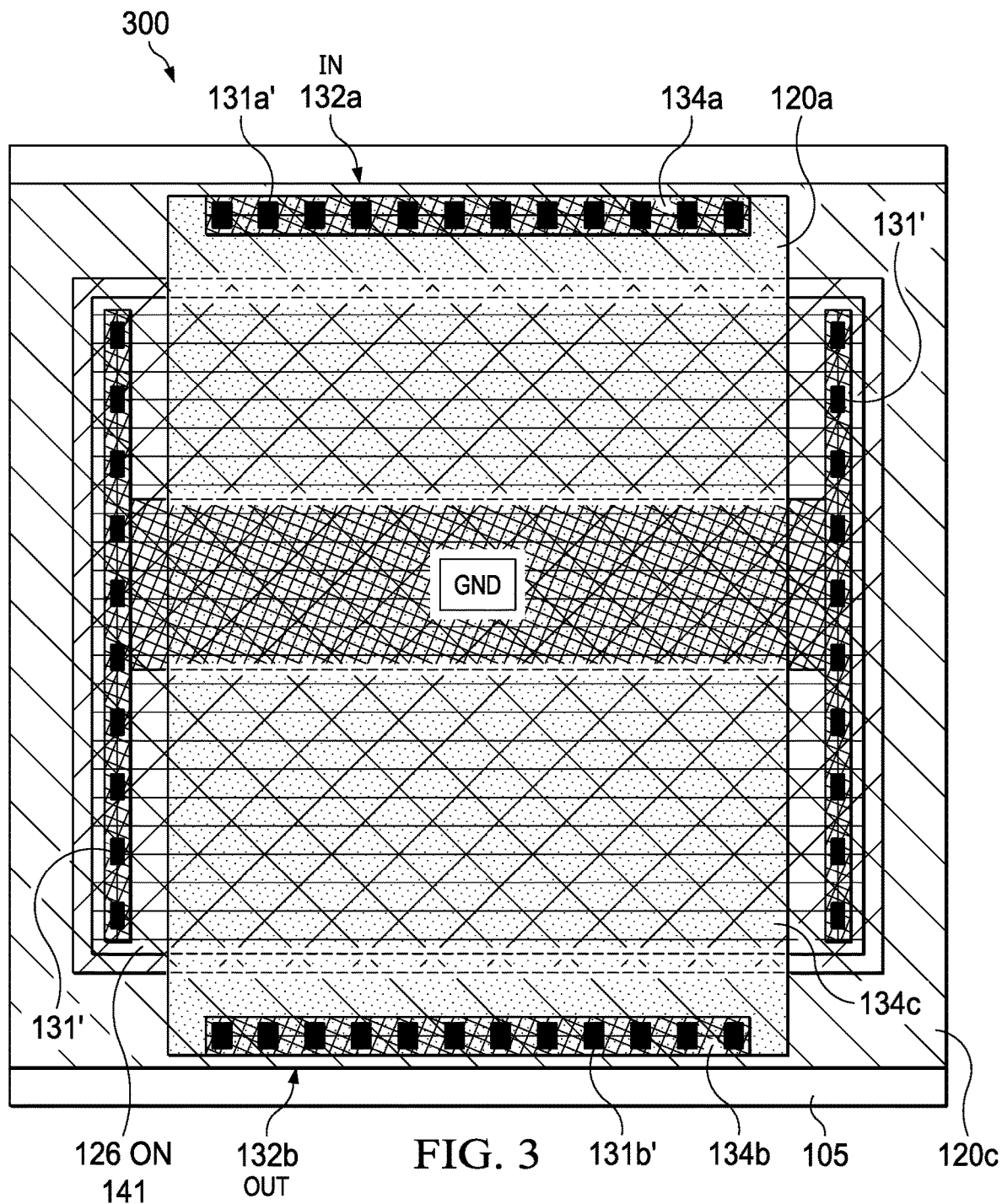
FIG. 3 shows a second arrangement comprising an RC filter, where the RC filter has a medium resistance value and an unchanged capacitance value from the modification to the polysilicon plate, according to an example aspect.

FIG. 3 shows a second arrangement comprising an RC filter 300, where the RC filter 300 has a medium resistance value and an unchanged capacitance value. A silicide block is included so that the polysilicon top plate 120a lacks the silicide layer that is elsewhere on the polysilicon on the IC. By adding a silicide block layer to block the generation of silicide on the polysilicon top plate 120a, the polysilicon plate only receives the source and drain implant, so that one can obtain about 10 times or more resistance as compared to the polysilicon resistance value including the silicide on top and the source/drain implant. This modification to the polysilicon top plate 120a comprising a silicide block thus provides RC filter 300 with a medium resistance value and unchanged capacitance value. There is the same location of IN terminal 132a, ground and OUT terminal 132b for RC filter 300 and multiple via contacts as for the RC filter 200 shown in FIG. 2.

Figure 4:
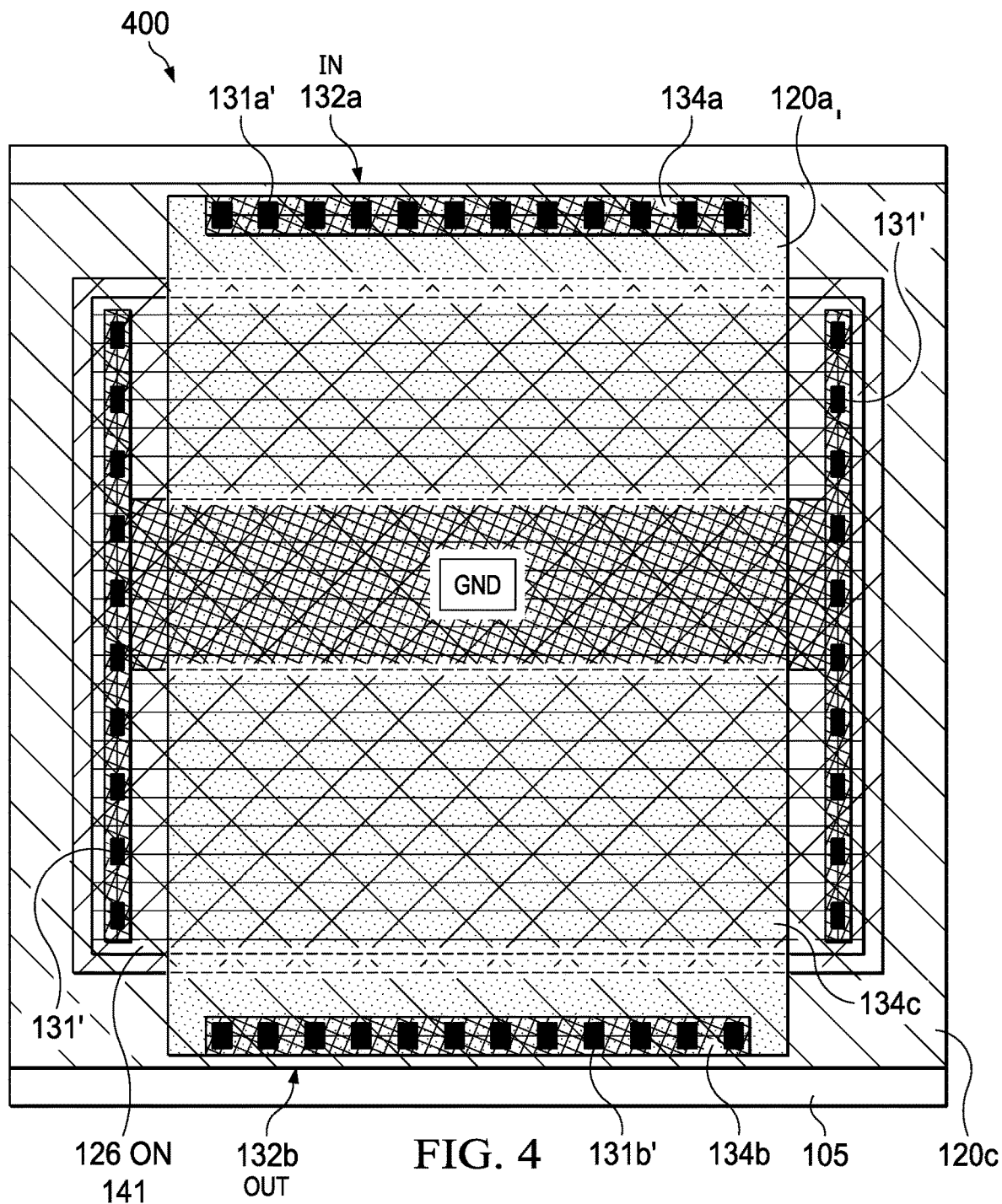
FIG. 4 shows a third arrangement comprising an RC filter, where the RC filter has a maximum resistance value and an unchanged capacitance value from the modification to the polysilicon plate, according to an example aspect.

FIG. 4 shows a third arrangement comprising an RC filter 400, where the RC filter 400 has a maximum resistance value and an unchanged capacitance value, and there is no silicide or source and drain implant applied to the polysilicon top plate so it is now shown as $120a_1$, only a LDD implant implanted into the polysilicon top plate 120a. This can be realized by adding a silicide block that blocks the generation of silicide on the polysilicon top plate 120a, and also blocking the source and drain implant using masking from reaching the polysilicon top plate 120a. As a result the RC filter 400 provides about 100 to 1,000 times the resistance value as compared to the intrinsic resistance value with silicide and source/drain implant to provide RC filter 400 having a maximum resistance value and an unchanged capacitance value.

Figure 5A:
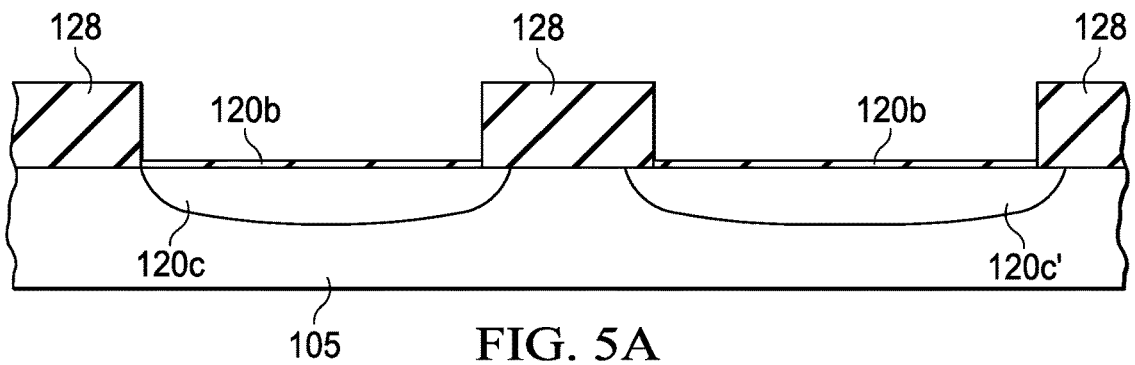
FIGS. 5A-F show cross sectional views of results after successive process steps in an example method of forming an IC including a disclosed RC filter.

FIGS. 5A-E are cross sectional views of results after successive process steps in an example method of forming an IC including a disclosed RC filter along with MOSFETs shown as a PMOS transistor 550 in this example. Any number of well-known processes for masking, etching, and diffusion or implantation may generally be used. FIG. 5A shows results after forming a doped diffusion layer shown as the bottom plate 120c for the C to be formed under a dielectric layer 120b which provides the C's dielectric that is formed on substrate 105 having at least a semiconductor surface. The doped diffusion layer also provides the nwell for the PMOS device shown as 120c'. The doped diffusion layer shown as the bottom plate 120c and the nwell 120c' are each shown formed in active areas that are between field oxide 128 regions shown as LOCOS that can also be STI. Dopant for the bottom plate 120c and nwell 120c' can be added by ion implantation or by diffusion to provide p-type or n-type impurities in the semiconductor surface, such as comprising arsenic or phosphorus in the case on n-type impurities.

By controlling the thickness of the dielectric layer 120b which is also in this example the gate dielectric layer for MOS devices on the IC to be thin, one can obtain a high unit capacitance value. The dielectric layer 120b as a gate dielectric layer can be in a thickness range of approximately 10 nm to 200 nm, formed by thermal oxidation or by a deposition process. This dielectric layer 120b thus may be the same thickness as the gate dielectric layer grown elsewhere on the substrate 105 for use as the gate dielectric (e.g., gate oxide) for MOS transistors on the IC including the in-process PMOS device shown.

Figure 5B:
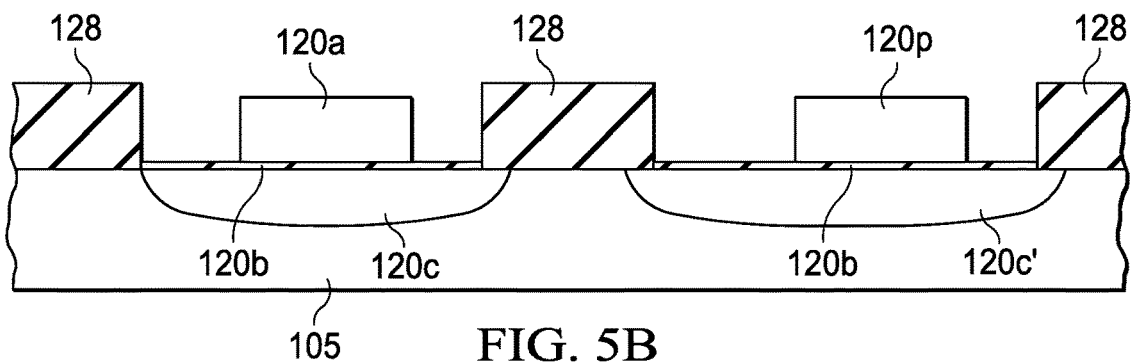

FIG. 5B shows results after forming a patterned doped polysilicon layer including forming the polysilicon top plate 120a shown for the C and the gate electrode 120p for the in-process PMOS device both on the dielectric layer 120b. Polysilicon can be deposited by low pressure chemical deposition (LPCVD) and then etched to provide the desired effective C plate area and the gates for the MOS devices. As described above, by controlling the existence of silicide on the surface of polysilicon top plate 120a and by controlling the polysilicon plate's doping concentration, one can obtain a high unit polysilicon resistance value for the RC filter.

Figure 5C:
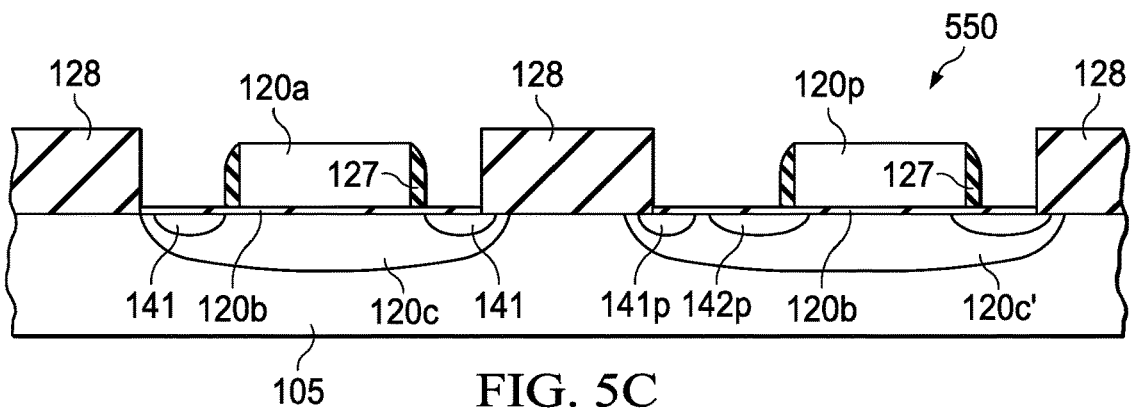

Spacers are then formed on the sidewalls of the polysilicon top plate 120a (e.g., using reactive-ion etching (ME)) shown for the C and for the gate electrode 120p. Spacer formation is followed by a p-source/drain masking level and implant to form p+ source and drain regions for the in-process PMOS device 550 shown as 142p and any p+ contacts needed on the IC such as for pwell contacts to a pwell such as for NMOS devices, and an n-source/drain masking level and implant to form n+ contacts 141 for the RC filter and a nwell contact 141p for contact to the nwell 120c' for the PMOS device 550. LDD formation is also generally included. FIG. 5C shows results after spacer formation followed by the p+ source/drain and n+ source/drain levels.

Figure 5D:
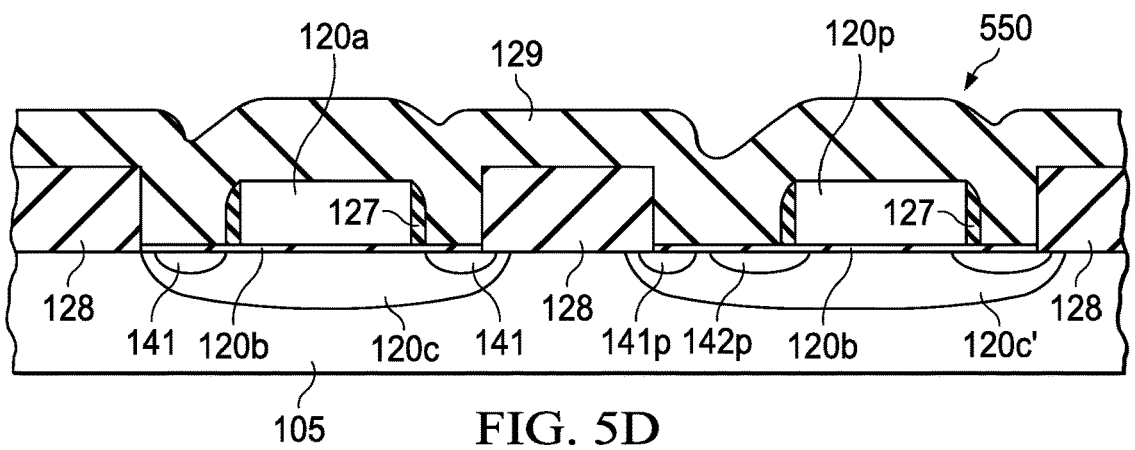
Figure 5E:
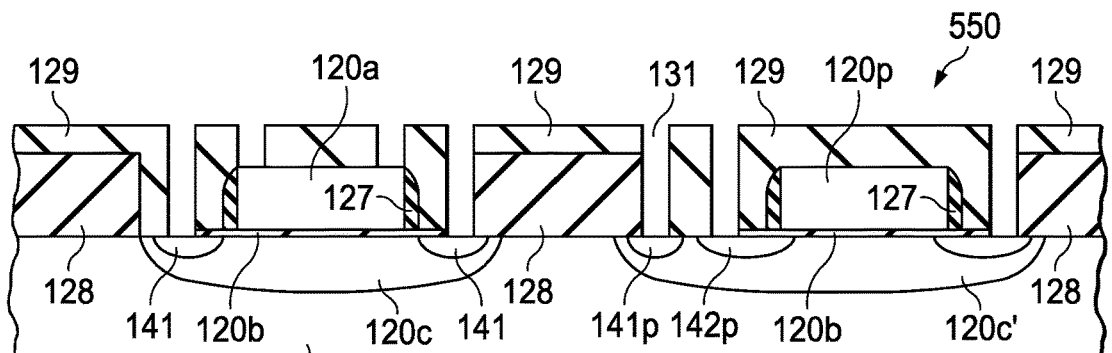

FIG. 5D shows results after forming an ILD layer 129. ILD layer 129 is a deposited dielectric layer, such as using a tetraethyl orthosilicate (TEOS)-based deposition process. FIG. 5E shows results after forming apertures in the ILD layer 129 to provide vias 131 that upon filling provide filled vias for contacts including an input contact contacting one end of the polysilicon top plate 120a, an output contact contacting an opposite end of the polysilicon top plate 120a, and a filled contact contacting the doped diffusion layer of the bottom plate 120c.

Figure 5F:
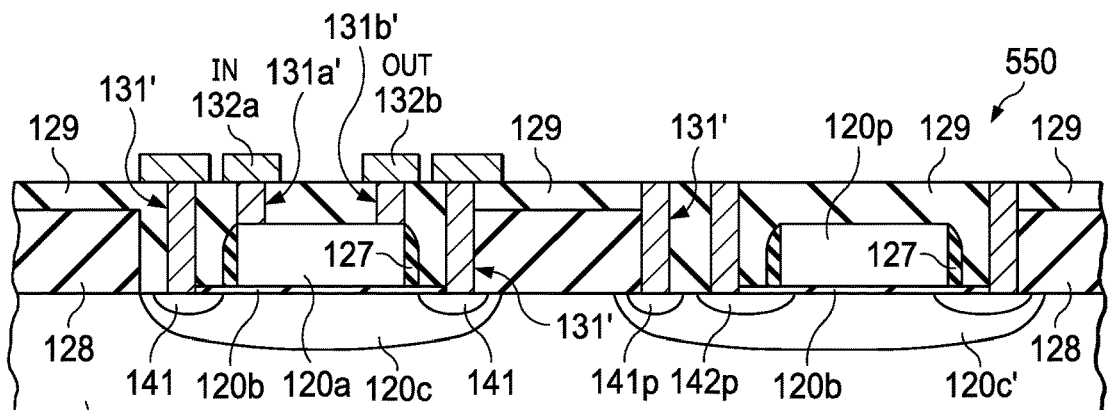

FIG. 5F shows results after filling the vias 131 to provide filled vias 131' for both the RC filter and the in-process PMOS device 550 followed by forming metal including to form IN 132a and OUT 132b for the RC filter. The RC filter shown in FIG. 5E can be seen to resemble the C 120 functioning as an RC filter shown in FIG. 1B described above. As known in the art, the IC process can then include subsequent metal layer stack formation with ILD layers in-between the metal layers, followed by passivating processing.

Disclosed RC filters can be provided in a variety of shapes, such as rectangular as noted above. Different shapes provide different resistance/capacitance combinations. Generally achievable resistance values in units of ohms include 10/20/50/300/1 k/2 k/50 k/100 k/300 k/600 k/1 M/1.5 M/2.4 Mohms. Generally achievable capacitance values in units of fF (1 fF=1×10$^{-15}$ F) is 30 fF to 240 fF (=0.24 pF).

One can use metal 1 (or another metal layer, such as metal 2 or metal 3) to provide extra capacitance for the RC filter, such as about 40 fF more, for a C having a polysilicon plate over a doped semiconductor bottom plate without any area increase by using the metal layer over the polysilicon plate. FIG. 6 shows an RC filter 600 having a top metal plate 134' which is shorted on the IC to the bottom plate 120c of the RC filter through filled vias 131' contacting silicide 126 on n+ contacts 141, with a polysilicon middle plate 120a' in-between, so that the resulting structure forms a sandwich structure. As with the RC filter shown in FIG. 2, the IN terminal 132a and the OUT terminal 132b are shown as string of multiple vias with the IN terminal 132a shown as a metal strip 134a that connects to one end of the polysilicon top plate 120a through a string of multiple filled vias 131'.

Similarly, the OUT terminal 132b is shown as a metal strip 134b that connects to the opposite end of the polysilicon top plate 120a in the length direction through a string of multiple filled vias 131'. The doped diffusion layer in this aspect being the bottom plate 120c has the top plate 134' coupled to its n+ contacts 141 on respective ends of the bottom plate 120c (both ends contacted to reduce parasitic resistance) by a string of multiple filled vias 131' as shown. As a result, there will be a parasitic C formed between the metal plate 134' and the polysilicon top plate 120a, such as having a capacitance of around 40 fF that is electrically in parallel (and thus additive in capacitance) to the capacitance of the RC filter's polysilicon plate over doped semiconductor bottom plate capacitance.

The achievable resistance and achievable capacitance value is the range one can generally obtain within a limited area by C shape variation. The achievable resistance and achievable capacitance value range does not mean any one achievable resistance can match with all the achievable capacitance to make a combination, and vice versa. For example, for a 1 kOhm resistance value, the achievable capacitance can generally vary from 80 fF to 200 fF. But this may change when the process is changed.

Disclosed RC filters are unlike traditional on die RC filters that are properly modeled by a lumped model with a single R and a single C. With a disclosed modification to the polysilicon plate, the proper model transforms into a distributed model, such as for one example properly modeled as having 10 stages with each stage RC having the same resistance and capacitance value.

Disclosed RC filters can realize far better performance in the relatively high frequency range for an RC filter, such as in a range from 10 MHz to 100 MHz, as compared to known RC filters that may have polysilicon as the R in a meander or a corrugated path. Such known RC filters can only work up to about 1 MHz to 2 MHz in frequency. The frequency performance for such known RC filters is limited by the way the RC filter is configured, having a meander or a corrugated path. Such path shape does provide a higher resistance value. However, this arrangement will incur more parasitic capacitance, which will generally heavily degrade the high frequency performance of the RC filter.

In contrast, disclosed RC filters use a polysilicon plate where the input is at one end of the C and the output is on the opposite end, and the R is straight (not in a meander or a corrugated path) so that only a small parasitic capacitance will be incurred and there is no added die area needed for the R. Disclosed RC filters being able to generally work up to the 10 MHz to 100 MHz frequency range means such RC filters are not limited to low pass filters, and can also be used in higher frequency applications such as band pass filters in a high frequency range, and in the feedback path in a high frequency loop. Moreover, as noted above, disclosed RC filters are compatible with existing IC processes, and do not require any extra IC mask levels or process steps to implement.

FIG. 7 depicts an analog IC 700 formed on a substrate 105 that includes analog circuitry comprising at least one MOSFET shown as an operational amplifier 710 configured in an inverting configuration as a second-order, multiple feedback low pass filter that includes at least one RC filter. Operational amplifier 710 as known in the art includes transistors (bipolar, MOS, or BiCMOS) and Rs configured to implement a differential amplifier that drives a voltage amplifier which drives an output amplifier. IC 700 is shown including two RC filters including RC filter $200_1$ comprising R3 and C4 and RC filter $200_2$ comprising R4 and C5. Neither terminal of C5 is connected to ground, while one terminal of C4 is connected to ground. When RC filter $200_1$ and RC filter $200_2$ are combined with operational amplifier 710 and R5 (which provides a second feedback path) as shown, the second-order, multiple feedback active low pass filter is realized.

EXAMPLES

Disclosed aspects are further illustrated by the following specific Examples, which should not be construed as limiting the scope or content of this Disclosure in any way.

Figure 8B:
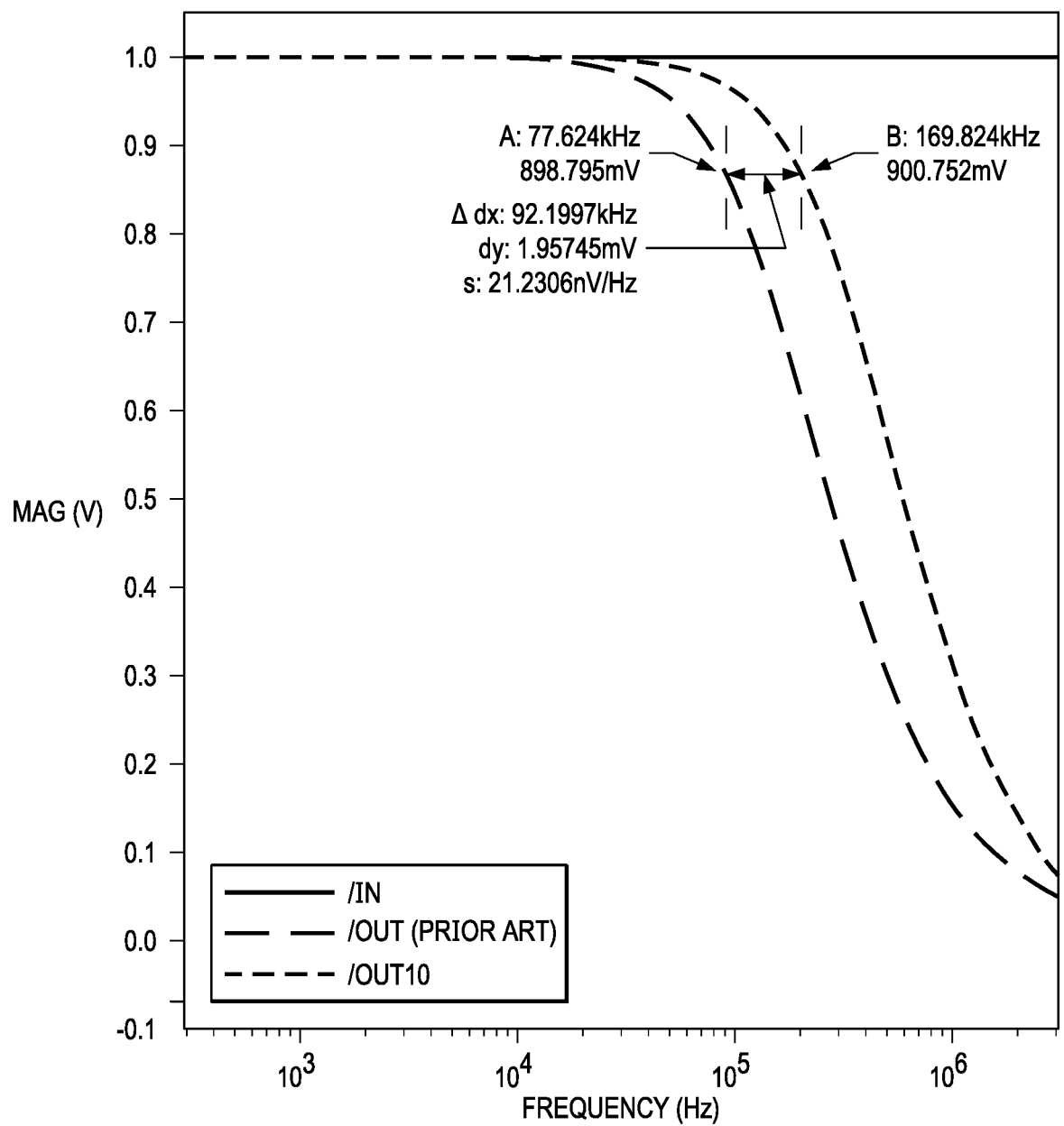
FIG. 8B shows a plot of the normalized signal magnitude vs. frequency for these respective RC filters.

FIGS. 8A and 8B show simulation results for a traditional RC filter having a polysilicon R and a separate C connected in series properly modeled as a single R and a single C and a disclosed RC filter properly modeled as a distributed RC filter having a plurality of series connected RC filters. FIG. 8A shows the comparative transient performance by showing Vout from the respective RC filters as a function of time after receiving an input pulse shown as IN. The disclosed RC filter can be seen to have a faster transient performance as compared to the traditional RC filter shown as 'Prior Art'.

FIG. 8B shows a plot of normalized signal magnitude vs. frequency. From the simulation results shown in FIG. 8B, one can see the frequency of the disclosed RC filter only changes less than 100 KHz through the 100 MHz to almost the 1 GHz range as compared to the traditional RC filter shown as 'Prior Art' which evidences one can use a disclosed modified polysilicon C to function as a RC filter in most common RC filter applications. Moreover, one can adjust the equivalent resistance value of a disclosed RC filter to eliminate this frequency change if desired.

Disclosed aspects can be used to form semiconductor die that may be integrated into a variety of assembly flows to form a variety of different devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, Insulated Gate Bipolar Transistor (IGBT), CMOS, BiCMOS and MEMS.

Those skilled in the art to which this Disclosure relates will appreciate that many other aspects and variations are possible within the scope of the claimed invention, and further additions, deletions, substitutions and modifications may be made to the described aspects without departing from the scope of this Disclosure.

The invention claimed is:

1. A method of forming a resistor capacitor (RC) filter on an integrated circuit (IC), comprising:
   providing a substrate having at least a semiconductor surface with a first dielectric layer on said semiconductor surface;
   forming a doped diffusion layer under said first dielectric layer;
   forming a patterned doped polysilicon layer on said first dielectric layer including forming a polysilicon plate for a capacitor of said RC filter;
   forming a silicide layer on said polysilicon plate;
   forming a second dielectric layer on said silicide layer;
   forming contacts including an input contact of the RC filter contacting one end of said silicide layer, an output contact of the RC filter contacting an opposite end of said silicide layer, and
   forming a metal layer providing contact to at least said input contact and said output contact.

2. The method of claim 1, wherein said IC includes analog circuitry, and wherein said RC filter is coupled to an input node or an output node on said analog circuitry.

3. The method of claim 1, wherein said polysilicon plate is a top plate for said capacitor, wherein said doped diffusion layer is a bottom plate for said capacitor, and wherein said contacts also include a contact contacting said doped diffusion layer.

4. The method of claim 1, wherein said polysilicon plate is a bottom plate for said capacitor, further comprising forming a top metal plate on said second dielectric layer over said polysilicon plate to provide a top plate for said capacitor.

5. The method of claim 1, further comprising forming a silicide layer on said doped polysilicon layer including on said polysilicon plate.

6. The method of claim 1, further comprising source and drain implanting after forming said doped polysilicon layer to form doped regions in said semiconductor surface including a source and drain for metal-oxide-semiconductor field-effect transistors (MOSFETs) on said IC while blocking said source and drain implant from implanting said polysilicon plate.

7. The method of claim 1, wherein said polysilicon plate is rectangular in shape.

8. The method of claim 1, wherein said RC filter does not include a discrete resistor.

9. The method of claim 1, wherein said polysilicon plate is a middle plate for said capacitor, wherein said doped diffusion layer is a doped semiconductor bottom plate to provide a bottom plate for said capacitor, and wherein said contacts also include a contact contacting said doped diffusion layer,
   further comprising forming a top metal plate on said second dielectric layer over said polysilicon plate to provide a top plate for said capacitor which contacts said contacts contacting said doped diffusion layer.

10. An integrated circuit (IC) including at least a resistor capacitor (RC) filter, comprising:
    a substrate having a semiconductor surface with a first dielectric layer on said semiconductor surface;
    a doped diffusion layer under said first dielectric layer;
    a patterned doped polysilicon layer on said first dielectric layer including a polysilicon plate for a capacitor of said RC filter and a gate for a metal-oxide-semiconductor field-effect transistor (MOSFET);
    forming a silicide layer on said polysilicon plate;
    a second dielectric layer on said silicide layer;

contacts including an input contact of the RC filter contacting one end of said silicide layer and an output contact of the RC filter contacting an opposite end of said silicide layer, a metal layer providing contact to at least said input contact and said output contact and analog circuitry comprising said MOSFET having an I/O node coupled to said RC filter.

11. The IC of claim 10, wherein said polysilicon plate is a top plate for said capacitor, wherein said doped diffusion layer is a bottom plate for said capacitor, and wherein said contacts also include a contact contacting said doped diffusion layer.

12. The IC of claim 10, wherein said polysilicon plate is a bottom plate for said capacitor, further comprising top metal plate on said second dielectric layer over said polysilicon plate to provide a top plate for said capacitor.

13. The IC of claim 10, further comprising source and drain diffusions in said semiconductor surface including a source and drain for said MOSFET exclusive of dopant from said source and drain diffusions in said polysilicon plate.

14. The IC of claim 10, wherein said polysilicon plate is rectangular in shape.

15. The IC of claim 10, wherein said RC filter does not include a discrete resistor.

16. The IC of claim 10, wherein said polysilicon plate is a middle plate for said capacitor, wherein said doped diffusion layer is a doped semiconductor bottom plate to provide a bottom plate for said capacitor, and wherein said contacts also include a contact contacting said doped diffusion layer, further comprising a top metal plate on said second dielectric layer over said polysilicon plate to a provide top plate for said capacitor which contacts said contacts contacting said doped diffusion layer.

17. The IC of claim 10, wherein said analog circuitry comprises an operational amplifier.

\* \* \* \* \*